(12) United States Patent
Matsubara

(10) Patent No.: US 8,232,481 B2
(45) Date of Patent: Jul. 31, 2012

(54) WIRING BOARD WITH COLUMNAR CONDUCTOR AND METHOD OF MAKING SAME

(75) Inventor: Daigo Matsubara, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 805 days.

(21) Appl. No.: 12/326,119

(22) Filed: Dec. 2, 2008

(65) Prior Publication Data
US 2009/0071700 A1    Mar. 19, 2009

Related U.S. Application Data

(63) Continuation-in-part of application No. PCT/JP2007/062014, filed on Jun. 14, 2007.

(30) Foreign Application Priority Data

Jun. 15, 2006    (JP) ................... 2006-166727

(51) Int. Cl.
*H05K 1/11* (2006.01)
*H05K 1/16* (2006.01)

(52) U.S. Cl. .............. 174/267; 174/260; 361/774

(58) Field of Classification Search ............ 174/260, 174/261, 267; 361/774, 779
See application file for complete search history.

(56) References Cited

U.S. PATENT DOCUMENTS

| | | | |
|---|---|---|---|
| 5,196,251 A * | 3/1993 | Bakhru et al. | 428/76 |
| 5,309,324 A * | 5/1994 | Herandez et al. | 361/734 |
| 5,525,402 A | 6/1996 | Nakamura et al. | |
| 5,547,530 A | 8/1996 | Nakamura et al. | |
| 6,205,032 B1 * | 3/2001 | Shepherd | 361/793 |
| 6,297,562 B1 * | 10/2001 | Tilly | 257/780 |

FOREIGN PATENT DOCUMENTS

| | | |
|---|---|---|
| JP | 09-83141 A | 3/1997 |
| WO | 2006/051916 A1 | 5/2006 |

OTHER PUBLICATIONS

Official Communication issued in International Patent Application No. PCT/JP2007/062014, mailed on Oct. 9, 2007.

* cited by examiner

*Primary Examiner* — Jeremy Norris
(74) *Attorney, Agent, or Firm* — Keating & Bennett, LLP

(57) ABSTRACT

A wiring board with a columnar conductor includes a wiring board defined by a multilayer ceramic board, a columnar conductor on an upper surface of the wiring board, and an insulating support portion arranged to support a side of the columnar conductor and having an external shape that expands from a tip of the columnar conductor toward the wiring board.

9 Claims, 19 Drawing Sheets

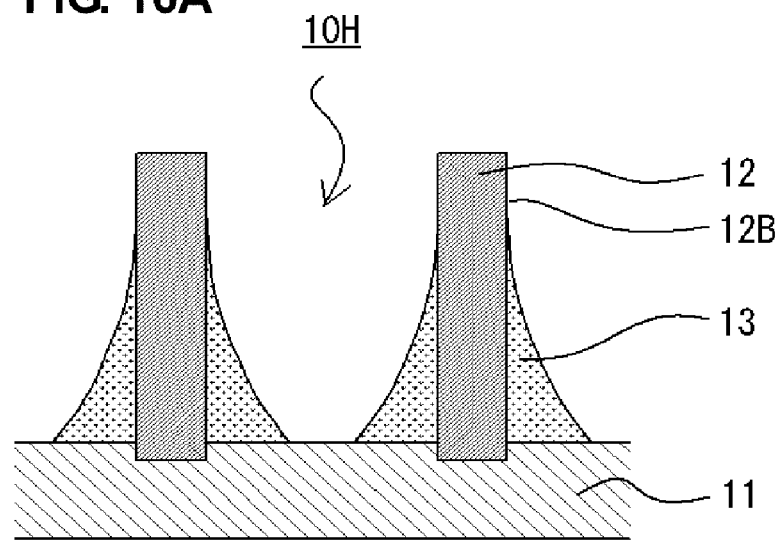
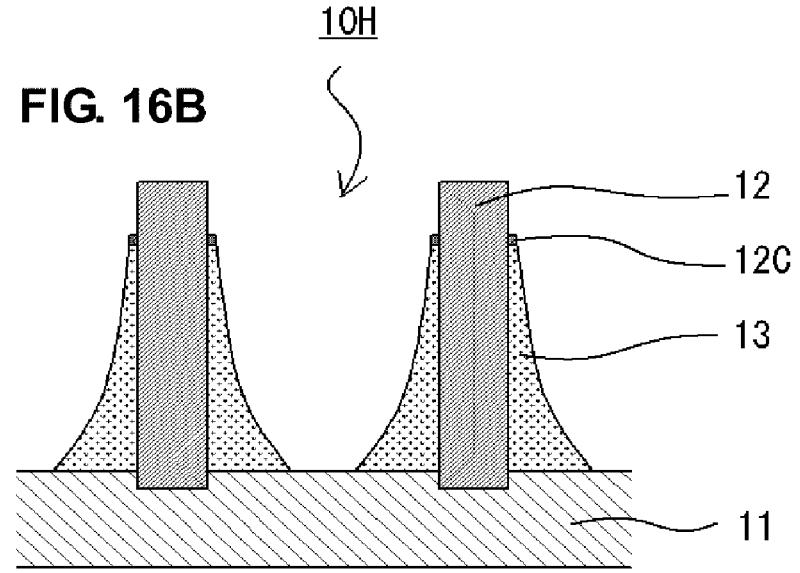

WIRING BOARD WITH COLUMNAR CONDUCTOR AND METHOD OF MAKING SAME

BACKGROUND OF THE INVENTION

1. Field of the Invention

The present invention relates to a wiring board with a columnar conductor protruding from a first main surface of the wiring board. More specifically, the present invention relates to a wiring board with a columnar conductor that is capable of improving reliability when mounted on a mounting substrate, such as a motherboard, and also relates to a method of making the same.

2. Description of the Related Art

One example of this type of wiring board is a multilayer ceramic board described in Japanese Unexamined Patent Application Publication No. 09-083141. The multilayer ceramic board is used as a chip-size packaging wiring board. To make a chip-size package, a semiconductor device is disposed on a projection electrode protruding from a multilayer ceramic board, the gap between the multilayer ceramic board and the semiconductor device is sealed with resin, and the semiconductor device is fixed to the multilayer ceramic board. That is, the semiconductor device is connected to a composite multilayer board including the multilayer ceramic board and the resin layer, and the protruding end surface of the projection electrode of the multilayer ceramic board and the surface of the resin layer are arranged so as to be substantially flush with each other.

The multilayer ceramic board having the projection electrode is obtained by disposing, on the upper surface of laminated green ceramic sheets for use in a board, a shrinkage suppressing sheet that includes an opening at a location corresponding to a via conductor passing through the laminated ceramic sheets defining a board and having a size to fit a projection electrode and that has a thickness corresponding to the height of the projection electrode, firing the composite, and utilizing firing shrinkage in the direction of the thickness of the ceramic sheets.

Here, the projection electrode described in Japanese Unexamined Patent Application Publication No. 09-083141 is an electrode used to dispose a semiconductor device on a multilayer ceramic board. When this projection electrode is used for a structure arranged to dispose the multilayer ceramic board on a motherboard, such as printed wiring board, one example of such a structure is illustrated in FIG. 19. That is, the example shown in FIG. 19 includes a semiconductor device 54 that is disposed on one main surface of a multilayer ceramic board 51, projection electrodes 52 arranged to connect the multilayer ceramic board 51 and a motherboard (not shown) are provided in the vicinity of the semiconductor device 54, and a resin layer 53 is provided such that the tip surface of each of the projection electrodes 52 is exposed.

However, with this structure, because the projection electrode 52 is embedded in the resin layer 53 and the upper end surface of the projection electrode 52 is substantially flush with the upper surface of the resin layer 53, in order to mount the multilayer ceramic board 51 on the motherboard, the projection electrode 52 of the multilayer ceramic board 51 and a surface electrode of the motherboard are connected to each other. However, in this case, because the motherboard and the resin layer 53 are substantially in close contact with each other, if the motherboard is distorted by, for example, thermal expansion and is curved toward the resin layer 53, the motherboard pushes the resin layer 53 upward. As a result, the multilayer ceramic board 51 may be disconnected from the motherboard or a crack may be produced in the multilayer ceramic board 51. If the semiconductor device 54 is disposed on the multilayer ceramic board 51, the semiconductor device 54 may be separated from the multilayer ceramic board 51.

When the semiconductor device 54 is mounted on the multilayer ceramic board 51 and the semiconductor device 54 and the multilayer ceramic board 51 are substantially entirely sealed with resin, the amount of resin required is relatively large. In this case, the curing shrinkage of the resin layer 53 may be increased, and the multilayer ceramic board 51 may be warped. As a result, the mounting on the motherboard may be difficult.

SUMMARY OF THE INVENTION

To overcome the problems described above, preferred embodiments of the present invention provide a wiring board having a columnar conductor that provides improved mountability on a motherboard, that suppresses a defective condition, such as a disconnection from the motherboard, and that is highly reliable, and preferred embodiments of the present invention also provide a method of making such a wiring board.

A wiring board with a columnar conductor according to a preferred embodiment of the present invention includes a wiring board having a first main surface, at least one columnar conductor on the first main surface of the wiring board, and an insulating support portion arranged to support a peripheral side of the at least one columnar conductor and having an external shape that expands from a tip of the at least one columnar conductor toward the wiring board.

The at least one columnar conductor on the first main surface of the wiring board may preferably include a plurality of columnar conductors. The insulating support portion may preferably connect the plurality of columnar conductors, be configured so as to expand from the tips of the columnar conductors toward the wiring board in a cross section substantially perpendicular to the direction in which the plurality of columnar conductors are arranged, and be configured so as to have a recess between the columnar conductors in a cross section substantially parallel to the direction in which the plurality of columnar conductors are arranged.

The insulating support portion may preferably be a support portion made primarily of resin, for example.

The wiring board may preferably be a multilayer ceramic board in which a plurality of ceramic layers are laminated.

The columnar conductor may preferably be made of a sintered metal fired simultaneously with the ceramic layers.

The plurality of columnar conductors may preferably be arranged in an outer peripheral region of the first main surface of the wiring board, and a surface-mountable electronic component may preferably be disposed inside the outer peripheral region of the first main surface.

A resin portion may preferably be arranged so as to at least fill a gap between the surface-mountable electronic component and the wiring board, and a height of the resin portion may preferably be less than a height of the insulating support portion.

A wiring board with a columnar conductor according to another preferred embodiment of the present invention includes a wiring board having a first main surface, a plurality of columnar conductors arranged on an outer peripheral region of the first main surface of the wiring board, an insulating support portion arranged to support a side of each of the columnar conductors, and a surface-mountable electronic component disposed inside the outer peripheral region of the first main surface.

A length from the first main surface of the wiring board to a tip of the columnar conductor may preferably be greater than a thickness of the surface-mountable electronic component.

A method of making a wiring board with a columnar conductor according to another preferred embodiment of the present invention includes the steps of fabricating a wiring board with a columnar conductor including a wiring board having a first main surface and at least one columnar conductor on the first main surface of the wiring board and forming an insulating support portion supporting a side of the at least one columnar conductor and having an external shape that expands from a tip of the at least one columnar conductor toward the wiring board.

The at least one columnar conductor on the first main surface of the wiring board may preferably include a plurality of columnar conductors. The insulating support portion may preferably connect the plurality of columnar conductors, be configured so as to expand from the tips of the columnar conductors toward the wiring board in a cross section substantially perpendicular to the direction in which the plurality of columnar conductors are arranged, and be formed so as to have a recess between the columnar conductors in a cross section parallel to the above direction of arrangement.

The step of fabricating a wiring board with a columnar conductor may preferably include the steps of fabricating a composite laminated structure including a green ceramic laminated structure, a green columnar conductor and a shrinkage suppressing layer that is not substantially sintered at a sintering temperature of the green ceramic laminated structure, firing the composite laminated structure at a temperature at which the green ceramic laminated structure and the green columnar conductor are sintered and the shrinkage suppressing layer is not substantially sintered, and removing the shrinkage suppressing layer being in a green state.

The method of making a wiring board with a columnar conductor according to a preferred embodiment of the present invention may preferably further include the step of disposing a surface-mountable electronic component inside an outer peripheral region of the first main surface of the wiring board, wherein the plurality of columnar conductors are arranged in the outer peripheral region of the first main surface.

The surface-mountable electronic component may preferably be disposed after the insulating support portion is formed.

Preferred embodiments of the present invention provide a wiring board with a columnar conductor having improved mountability on a motherboard, that suppresses a defective condition, such as a disconnection from the motherboard, and that is highly reliable and provides a method of making the same.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 1A to 1C illustrate a wiring board with a columnar conductor according to a preferred embodiment of the present invention, wherein FIG. 1A is a plan view thereof, FIG. 1B is a cross-sectional view taken along the line B-B of the wiring board illustrated in FIG. 1A, and FIG. 1C is a cross-sectional view taken along the line C-C of the wiring board illustrated in FIG. 1A.

FIGS. 16A and 16B are cross-sectional views illustrating yet other modified examples of the wiring board with a columnar conductor illustrated in FIGS. 1A to 1C.

DETAILED DESCRIPTION OF PREFERRED EMBODIMENTS

Preferred embodiments of the present invention are described with reference to FIGS. 1A to 18.

First Preferred Embodiment

First, a wiring board with a columnar conductor according to the present preferred embodiment is described with reference to FIGS. 1A through 7.

Figure 1A:
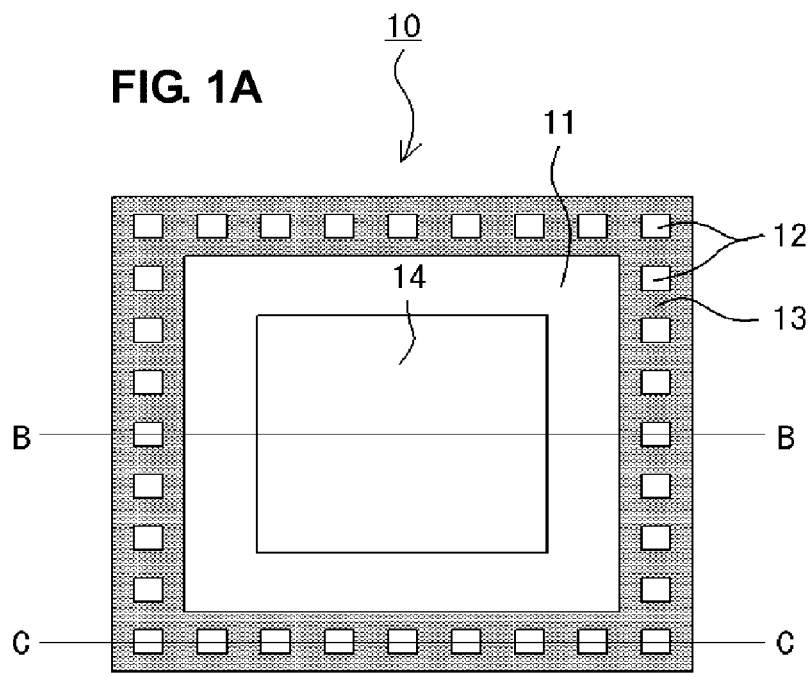

As illustrated in, for example, FIG. 1A, a wiring board 10 with a columnar conductor according to the present preferred embodiment includes a wiring board 11 having a first main surface (upper surface), a plurality of columnar conductors 12 provided along substantially the entire outer peripheral portion of the upper surface, and an insulating support portion 13 arranged to support the columnar conductors 12 from their sides and connecting the columnar conductors 12 to each other.

Figure 1B:
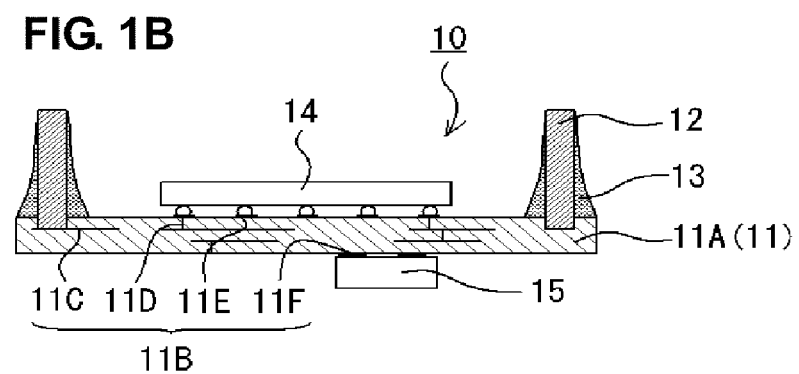
Figure 1C:
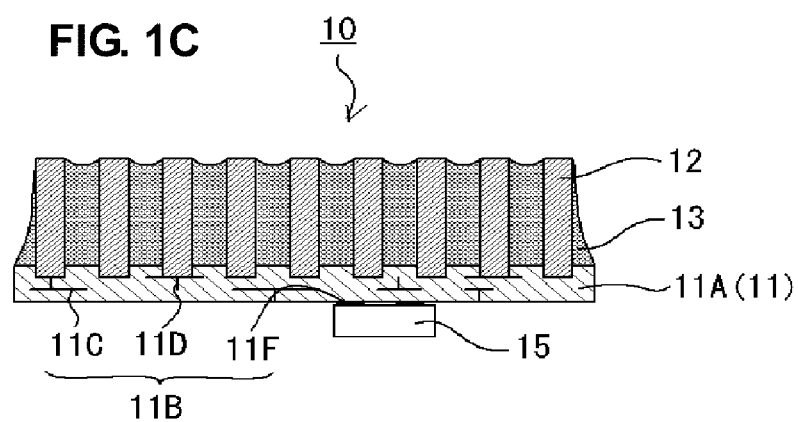

As illustrated in FIGS. 1B and 1C, the wiring board 11 is preferably defined by a multilayer ceramic board in which a plurality of ceramic layers 11A are laminated. The multilayer ceramic board includes a wiring pattern 11B having a predetermined pattern. The wiring pattern 11B includes an in-plane conductor 11C provided at an interface between upper and lower ceramic layers 11A, a via-hole conductor 11D electrically connecting upper and lower in-plane conductors 11C and passing through the ceramic layers 11A, and surface electrodes 11E and 11F provided on the upper and lower surfaces, respectively. The wiring pattern 11B and the columnar conductors 12 are electrically connected to each other.

As illustrated in FIG. 1B, the insulating support portion 13 is in close contact with the sides of the plurality of columnar conductors 12 and covers the sides of the columnar conductors 12. The insulating support portion 13 is arranged so as to expand from the tip of each of the columnar conductors 12 toward the board in a cross section substantially perpendicular to the direction in which the columnar conductors 12 are arranged, as illustrated in FIG. 1B. In this cross section, the portions of the insulating support portion 13 covering the columnar conductors 12 at both ends of the wiring board 11A are separated from each other. In a cross section substantially parallel to the direction in which the columnar conductors 12 are arranged, as illustrated in FIG. 1C, the insulating support portion 13 is arranged so as to be recessed between the adjoining columnar conductors 12. The side of each of the columnar conductors 12 is covered with the insulating support portion 13, whereas the top end surface of the columnar conductor 12 is exposed so as to be connected to a motherboard. The insulating support portion 13 can be formed by applying liquid thermosetting resin (referred to simply as "liquid resin") having high heat and humidity resistance, such as epoxy resin, phenolic resin, and cyanate resin, for example, and curing the resin. The liquid resin may preferably include inorganic powder, such as silica, for example.

As illustrated in FIGS. 1A to 1C, a first surface-mountable electronic component 14 is disposed on the upper surface of the wiring board 11 inside the plurality of columnar conductors 12, and a second surface-mountable electronic component 15 is disposed on the lower surface of the wiring board 11. The first surface-mountable electronic component 14 and the second surface-mountable electronic component 15 may be of substantially the same type or may be of different types, depending on the application. The first surface-mountable electronic component 14 may preferably include an active element, such as silicon semiconductor device or gallium arsenide semiconductor device, for example. The first surface-mountable electronic component 14 can be electrically connected to a surface electrode (not shown) of the wiring board 11 through, for example, a solder ball, as illustrated in FIG. 1B. The active element may be connected to the surface electrode through a bonding wire made of, for example, gold, aluminum, or copper. The second surface-mountable electronic component 15 can include a passive element, such as a capacitor, inductor, or resistor, for example. The second surface-mountable electronic component 15 can be electrically connected to a surface electrode (not shown) through, for example, soldering or conductive resin.

Thus, the wiring board 11 can be made of a ceramic material, as described above. One example of a ceramic material is a low temperature co-fired ceramic (LTCC) material. LTCC materials are ceramic materials that can be sintered at or below about 1050° C. and can be fired simultaneously with silver or copper, both of which have a small resistivity. Examples of the LTCC material include a glass composite LTCC material including a mixture of borosilicate glass and ceramic powder, such as alumina, zirconium oxide, magnesium oxide, or forsterite, for example, a crystallization glass LTCC material using $ZnO$—$MgO$—$Al_2O_3$—$SiO_2$ crystallization glass, and a non-vitreous LTCC material using $BaO$—$Al_2O_3$—$SiO_2$ ceramic powder or $Al_2O_3$—$CaO$—$SiO_2$—$MgO$—$B_2O_3$ ceramic powder.

Each of the wiring patterns 11B of the wiring board 11 and the columnar conductors 12 can preferably be made of a conductive metal. Examples of the conductive metal include silver, a silver-platinum alloy, and a metal composed principally of at least one of copper, platinum, palladium, tungsten, molybdenum, and gold. When an LTCC material is used as the material of the wiring board 11, among these conductive metals, silver, a silver-platinum alloy, a silver-palladium alloy, and copper can be preferably used because they have a small resistivity. It is preferable that the wiring board 11 be fired simultaneously with the wiring pattern 11B and the columnar conductor 12 at a low temperature not greater than about 1000° C. The metal material of the wiring board 11 and that of the columnar conductor 12 may preferably be substantially the same. However, different metal materials may also be used. For example, the metal material of the wiring pattern may be copper, whereas the metal material of the columnar conductor 12 may be silver.

A method of making a wiring board with a columnar conductor according to a preferred embodiment of the present invention will be described with reference to the cross-sectional views illustrated in FIGS. 2A to 6B. In the present preferred embodiment, the wiring board 10 with a columnar conductor is preferably fabricated using a non-shrink construction method. The non-shrink construction method is a construction method in which the dimensions of a ceramic board in a plane direction are not substantially changed before and after the firing of the ceramic board. In the non-shrink construction method, a ceramic green sheet provided to suppress shrinkage, which will be described below, is used.

1. Fabricating Wiring Board with Columnar Conductor

1) Fabricating Ceramic Green Sheet

First, mixed powder of LTCC powder (e.g., alumina powder) and borosilicate glass is prepared. This mixed powder is distributed in an organic vehicle to produce slurry. This is shaped into a sheet by casting, for example, thereby fabricating a predetermined number of ceramic green sheets 111A use for a wiring board (hereinafter referred to as wiring-board ceramic green sheets) illustrated in FIG. 2A, each of the wiring-board ceramic green sheets 111A having a thickness of, for example, about 20 μm. Then, a via hole is formed with a predetermined pattern in one of the ceramic green sheets 111A using, for example, laser light or a die. After that, the via hole is filled with conductive paste, thus forming a green via-hole conductor 111D. One example of the conductive paste is paste primarily including silver. After that, the same conductive paste as that used in the via-hole conductor is applied on the wiring-board ceramic green sheet 111A so as to print a predetermined pattern by, for example, screen printing, thus forming an in-plane green conductor 111C thereon. In a similar manner, another columnar green via-hole conductor 111D and a green surface electrode 111E are formed on another wiring-board ceramic green sheet 11A. Moreover, another green via-hole conductor 111D and a green surface electrode 111F are formed on yet another wiring-board ceramic green sheet 11A.

2) Fabricating Ceramic Green Sheet for Suppressing Shrinkage

Ceramic green sheets used to suppress shrinkage (hereinafter referred to as shrinkage-suppressing ceramic green sheets) are made primarily of sintering-resistant ceramic that is not sintered at the sintering temperature of LTCC as a base material. Alumina powder can be provided as the sintering-resistant ceramic, for example. This alumina powder is distributed into organic vehicle to produce slurry, and this is shaped into a sheet form by casting, thus fabricating a predetermined number of shrinkage-suppressing ceramic green sheets 100' illustrated in FIG. 2A. The sintering temperature of the shrinkage-suppressing ceramic green sheets 100' is in the range of about 1500° C. to about 1600° C., for example, which is significantly higher than the sintering temperature of the wiring-board ceramic green sheets 111A composed of LTCC (e.g., about 890° C.). Accordingly, the shrinkage-suppressing ceramic green sheets 100' are not substantially sintered at the sintering temperature of the wiring-board ceramic green sheets 11A. After a hole (e.g., about 0.5 mm×about 0.6 mm) for use in a columnar conductor is formed in a predetermined shrinkage-suppressing ceramic green sheet 100' with a predetermined pattern using laser light or a die, for example, the hole is filled with conductive paste primarily including silver to form a green columnar conductor 112, thus forming a shrinkage-suppressing ceramic green sheet 100'A. In addition to alumina ceramic powder, zirconium-oxide ceramic powder and magnesium-oxide ceramic powder are also usable as the sintering-resistant ceramic powder, for example. It is preferable that the shrinkage-suppressing ceramic green sheets 100' and 100'A include substantially the same ceramic ingredient as that included in the wiring-board ceramic green sheet 11A.

3) Fabricating Green Composite Laminated Structure

Figure 2A:
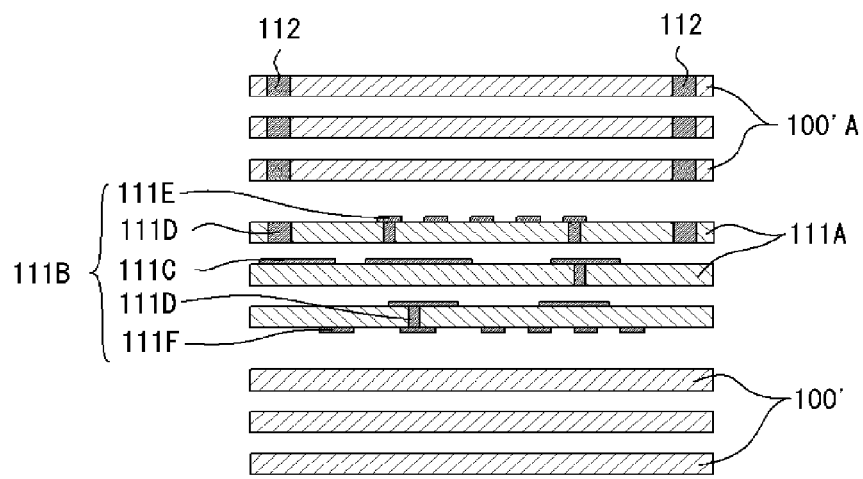
FIGS. 2A to 2C illustrate a method of making a wiring board with a columnar conductor according to a preferred embodiment of the present invention and illustrate, in cross section, a process of main portions of the method of making a wiring board with a columnar conductor illustrated in FIGS. 1A to 1C.
Figure 2B:
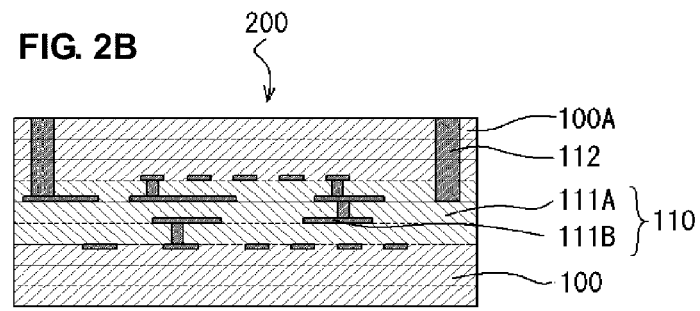

As illustrated in FIG. 2B, three shrinkage-suppressing ceramic green sheets 100' that do not include a green columnar conductor 112 are laminated to form a shrinkage suppressing layer 100. The wiring-board ceramic green sheet 111A having the green surface electrode 111F is laminated on the shrinkage suppressing layer 100 such that the green surface electrode 111F faces downward. The resultant laminated composite is overlaid with the wiring-board ceramic green sheet 111A having the in-plane green conductor 111C and the columnar green via-hole conductor 111D. This laminated composite is overlaid with the wiring-board ceramic green sheet 111A having the green surface electrode 111E and the columnar green via-hole conductor 111D such that the green surface electrode 111E faces upward. Accordingly, a green ceramic laminated structure 110 having a green wiring pattern 111B is formed. Then, after the green columnar conductors 112 and the green via-hole conductors 111D (defining a portion of the green columnar conductor) of the wiring-board ceramic green sheet 111A are substantially aligned, the three shrinkage-suppressing ceramic green sheets 100'A are laminated on the green ceramic laminated structure 110 to form a shrinkage suppressing layer 100A. After the formation of the shrinkage suppressing layer 100A, a pressure of about 200-1500 kg/cm$^2$ is applied in the direction of the lamination (i.e., substantially vertically) to the composite structure to press and bond the layers. In this manner, a green composite laminated structure 200 in which the layers are integrated, which includes the green wiring pattern 111B, as illustrated in FIG. 2B, is obtained.

4) Firing Composite Laminated Structure

Figure 2C:
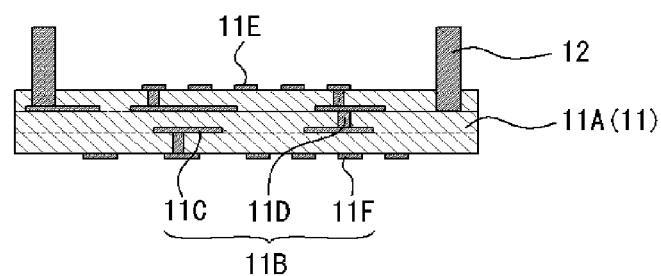

When the green composite laminated structure 200 is fired at a predetermined temperature of, for example, about 890° C., because the shrinkage suppressing layers 100 and 100A are not substantially sintered and thus do not substantially shrink in the plane direction, the green ceramic laminated structure 110 does not substantially shrink in the plane direction due to the shrinkage suppressing layers 100 and 100A and shrinks only in a thickness direction. Accordingly, the wiring board 11 having the wiring pattern 11B and columnar conductor 12 formed with high precision, as illustrated in FIG. 2C, is produced. This firing causes the shrinkage suppressing layers 100 and 100A to lose their organic vehicle, thus forming an alumina powder aggregate. The aggregate of alumina powder is easily removed by blasting or other processing. As a result, the wiring board 11 having the plurality of columnar conductors 12 arranged in its outer peripheral region is obtained. Each of the columnar conductors 12 preferably has a size of about 0.5 mm in length×about 0.5 mm in width×about 0.5 mm in height, for example. In FIGS. 2A to 2C, among a group of simultaneously fabricated wiring boards 10 with columnar conductors, only one of them is illustrated.

5) Plating

The wettability of a connection member, such as solder, can be improved by plating of the surface electrodes 11E and 11F and the columnar conductors 12 with, for example, nickel/gold after the wiring board 11 having the columnar conductors 12 is fabricated.

Figure 3A:
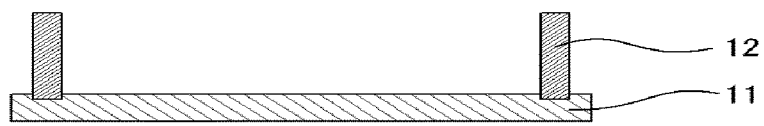
FIGS. 3A to 3C illustrate, in cross section, main portions of a process subsequent to the process illustrated in FIGS. 2A to 2C.
Figure 3B:
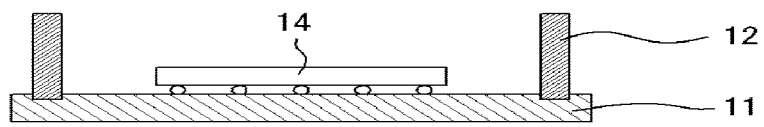
Figure 3C:
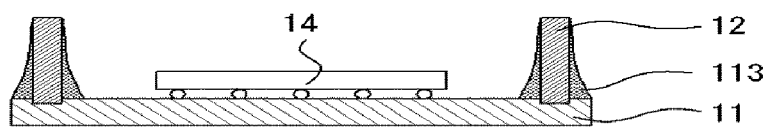
Figure 4:
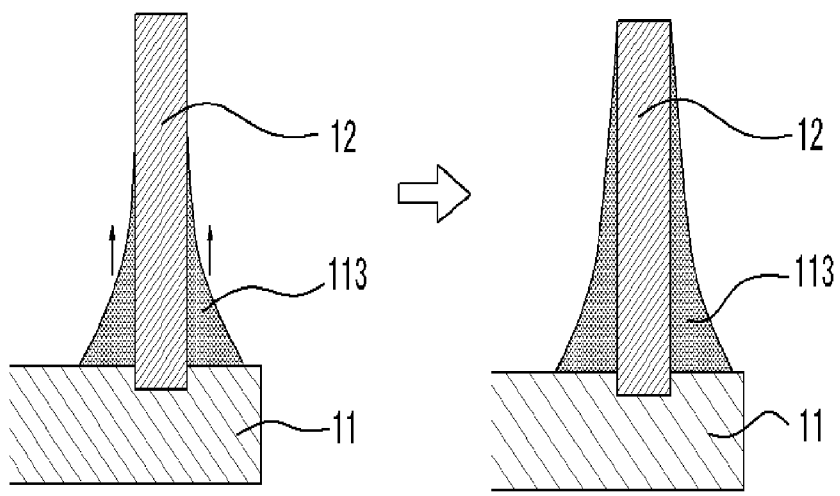
FIG. 4 illustrates a state in which liquid resin wicks up along a columnar conductor in the process illustrated in FIG. 3B and is a cross-sectional view substantially perpendicular to the direction in which the columnar conductors are arranged.
Figure 5:
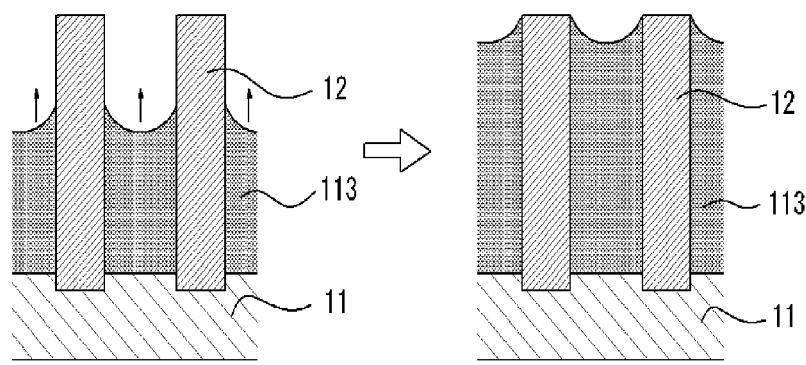
FIG. 5 corresponds to FIG. 4 and is a cross-sectional view substantially parallel to the direction in which the columnar conductors are arranged.

6) Mounting Surface-Mountable Electronic Component and Forming Insulating Support Portion As illustrated in FIG. 3A, after the wiring board 11 is arranged such that the columnar conductors 12 face upward, a bare chip is disposed as the first surface-mountable electronic component 14 using a mounter (not shown), as illustrated in FIG. 3B, and is connected to the surface electrode of the wiring board 11. After that, for example, liquid epoxy resin can be supplied as liquid resin 113 over substantially the entire circumference of the roots of the columnar conductors 12 while a dispenser (not shown) is moved along the direction in which the columnar conductors 12 are arranged. Thus, the liquid resin 113 gradually wicks up toward the top ends of the columnar conductors 12 in the gap between the columnar conductors 12 by capillary action, as illustrated in FIGS. 4 and 5. As a result, as illustrated in FIG. 3C, the liquid resin 113 covers substantially the entire sides of the columnar conductors 12 and its external shape expands toward their roots so as to have a fillet shape or a conical or pyramidal shape, for example. At this point, the liquid resin does not substantially wick up to the top end surface of each of the columnar conductors 12. Because the liquid resin 113 wicks up along the columnar conductor 12 by capillary action, it does not extend onto the top end surface of the columnar conductor 12, so the entire top end surface is exposed so as to be used as a joint surface to a motherboard M. After that, the insulating support portion 13 connecting the plurality of columnar conductors 12, as illustrated in FIGS. 1B and 1C, is formed by curing the liquid resin 113 by heat treatment. The resinous insulating support portion is not necessarily required to be in direct contact with the columnar conductors. For example, the resinous insulating support portion may be in close contact with the columnar conductors with a glass layer provided therebetween.

2. Mounting Wiring Board with Columnar Conductor on Motherboard

Figure 6A:
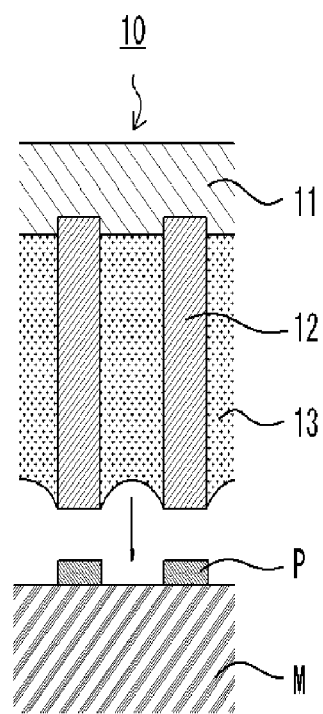
FIGS. 6A and 6B are cross-sectional views showing how the wiring board with a columnar conductor illustrated in FIGS. 1A to 1C is mounted on a motherboard.
Figure 6B:
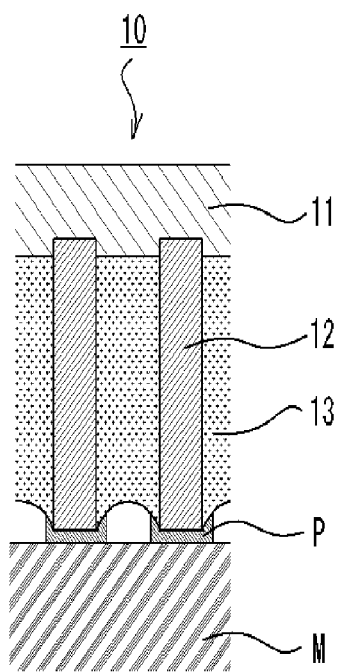

Solder paste P is applied on the surface electrode (not shown) of the motherboard M by screen printing, for example, as illustrated in FIG. 6A. Then, the wiring board 10 is disposed directly above the motherboard M using, for example, a mounter such that the columnar conductor 12 faces downward. After the columnar conductor 12 and the solder paste P are substantially aligned, the wiring board 10 is moved downward, as indicated by the arrow illustrated in FIG. 6A, and the columnar conductor 12 and the solder paste P are connected to each other, as illustrated in FIG. 6B. At this time, the solder paste P wets the columnar conductor 12 and also flows and spreads to the surrounding area. Because the insulating support portion 13 is recessed between the adjoining columnar conductors 12, the solder paste P is prevented from spreading to the surrounding areas on the wiring board 11. Accordingly, short circuiting between the adjoining portions of the solder paste P does not occur.

Figure 7:
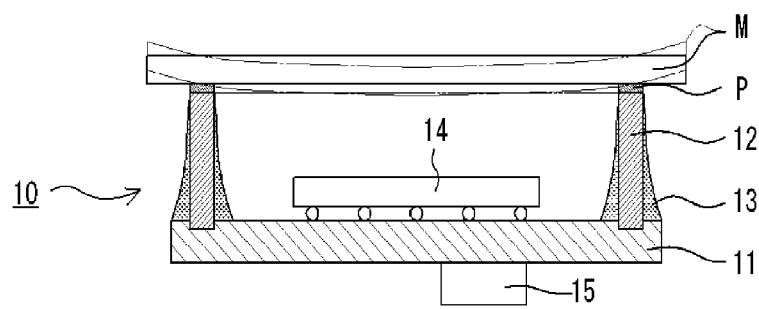
FIG. 7 is a cross-sectional view showing a state in which the wiring board with a columnar conductor illustrated in FIG. 1 is mounted.

FIG. 7 is a cross-sectional view that illustrates a state in which the wiring board 10 with a columnar conductor is mounted on the motherboard M. As illustrated in FIG. 7, the wiring board 10 is connected to the motherboard M through the columnar conductors 12 supported by the insulating support portion 13. Thus, for example, even if the motherboard M is distorted by thermal expansion or other changes such that it is curved from the state indicated by solid lines in FIG. 7 toward the wiring board 11, as indicated by alternate long and short dashed lines, the distance between the wiring board 11 and the motherboard M is relatively and a stress acting from the motherboard M toward the wiring board 11 is reduced by the columnar conductors 12 and the insulating support portion 13. Accordingly, the occurrence of cracks in the wiring board 11 caused by an impact produced by falling, for example, can be significantly reduced. Because the insulating support portion 13 supports the columnar conductors 12 such that it expands toward their roots, the insulating support portion 13 is formed so as to be lower than the joint surface of each of the columnar conductors 12, and furthermore, the columnar conductor 12 is located higher than the semiconductor device 14, even if the motherboard M is deformed after the mounting, the motherboard M does not push the wiring board 11 upward. Thus, the occurrence of cracks in the wiring board 11 can be reliably prevented, and the wiring board 10 with a columnar conductor can be prevented from being disconnected from the motherboard M.

Further, because the insulating support portion 13 connects the plurality of columnar conductors 12 in the direction of arrangement thereof and is also arranged so as to expand toward the wiring board 11 from the top end of each of the columnar conductors 12, the amount of resin that is used can be reduced. As a result, the amount of curing shrinkage of the resin can be reduced, and the amount of curling in the wiring board 11 can be reduced. This reduces the number defective items and the cost. Because the columnar conductor 12 is made of silver, conductivity, heat dissipation, and solder joining are improved.

As described above, according to the present preferred embodiment, the wiring board 10 with a columnar conductor includes the wiring board 11, the columnar conductors 12 disposed on the upper surface of the wiring board 11, and the insulating support portion 13 supporting the side of each of the columnar conductors 12 and having an external shape that expands from the tip of the columnar conductor 12 toward the wiring board 11. Accordingly, even if the motherboard M is deformed by thermal expansion or other changes after the wiring board 10 with a columnar conductor is mounted on the motherboard M, a stress caused by the deformation is relieved by the columnar conductor 12 supported by the insulating support portion 13. This suppresses deformation of the wiring board 11 and the occurrence of cracks in the wiring board 11 and can also increase the resistance to an impact caused by falling, for example, and resistance to a lateral push test. Because the top end surface of the columnar conductor 12 and the top of the insulating support portion 13 are flush with the connection surface of the motherboard M, the quality of the connection can be readily checked.

According to the present preferred embodiment, there is no connection between the plurality of columnar conductors 12 in the direction substantially perpendicular to the direction of arrangement thereof achieved by the insulating support portion 13 for the adjoining columnar conductors 12. Accordingly, the columnar conductors 12 themselves are deformed when a stress is applied on the wiring board 11, the columnar conductors 12, and the connection therebetween. Thus, the stress applied to the wiring board 11, the columnar conductors 12, and the joint therebetween can be relieved and cracking in those portions can be prevented. Thus, the resistance to an impact caused by falling, for example, and resistance to a lateral push test can be increased. Because the insulating support portion 13 is recessed between the adjoining columnar conductors 12, the solder paste P enters the recess of the insulating support portion 13 during the mounting on the motherboard M. This prevents spreading of the solder paste P to the surrounding areas on the wiring board 11 and prevents short circuiting between the adjoining portions of the solder paste P.

Second Preferred Embodiment

Figure 8A:
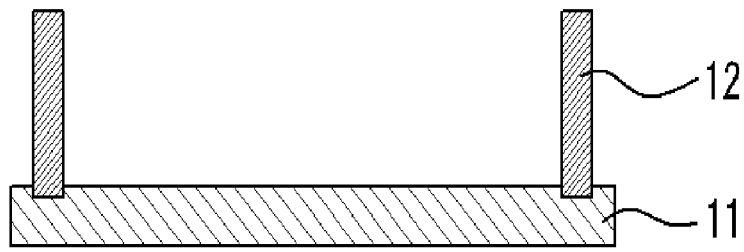
FIGS. 8A through 8C illustrate the method of making a wiring board with a columnar conductor according to another preferred embodiment of the present invention and illustrate, in cross section, main portions of a process subsequent to the process illustrated in FIGS. 2A to 2C.
Figure 8B:
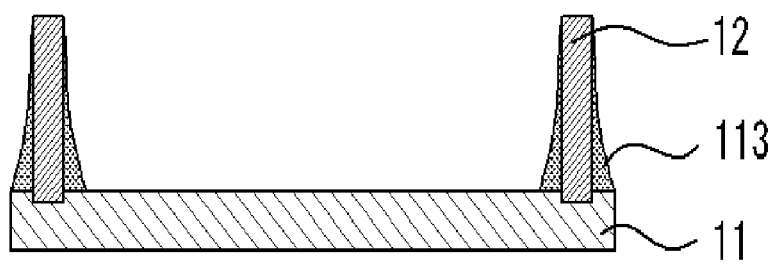
Figure 8C:
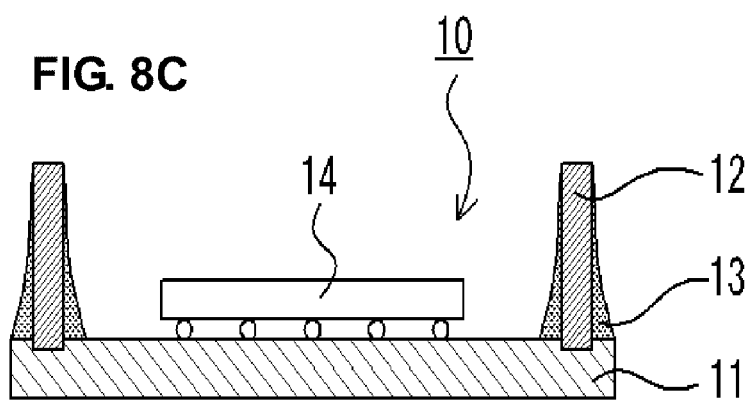

In the first preferred embodiment, as illustrated in FIGS. 3A to 3C, after the first surface-mountable electronic component 14 is disposed at a predetermined location on the wiring board 11, the insulating support portion 13 is provided to the columnar conductor 12. In the present preferred embodiment, after the insulating support portion 13 is provided, the first surface-mountable electronic component 14 is disposed. That is, as illustrated in FIG. 8A, the wiring board 11 is arranged such that the columnar conductors 12 face upward. Then, as illustrated in FIG. 8B, the liquid resin 113 is provided to the root of the gap between the plurality of columnar conductors 12 using substantially the same technique as in the first preferred embodiment to form the insulating support portion 13 connecting the plurality of columnar conductors 12. After that, a bare chip is disposed as the first surface-mountable electronic component 14 inside the columnar conductors 12.

According to the present preferred embodiment, after the plurality of columnar conductors 12 are connected by the insulating support portion 13, the first surface-mountable electronic component 14 is disposed on the wiring board 11. Thus, after the quality of the insulating support portion 13 is determined, the first surface-mountable electronic component 14 can be disposed on only wiring boards 11 including non-defective insulating support portions 13. Accordingly, the first surface-mountable electronic component 14 is not wasted and the cost of manufacturing can be reduced accordingly.

Next, modified examples of the wiring board with a columnar conductor according to the first and second preferred embodiments will be described with reference to the cross-sectional views and plan views illustrated in FIGS. 9 through 18 using the same reference numerals for the same or corresponding parts as in the first and second preferred embodiments.

First Modified Example

Figure 9:
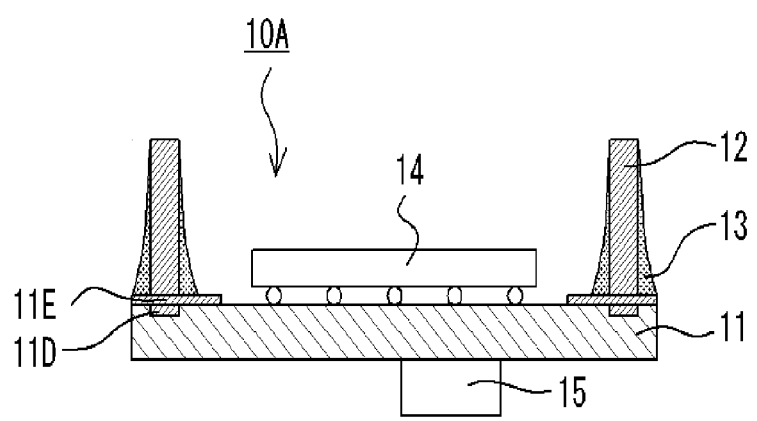
FIG. 9 is a cross-sectional view illustrating a modified example of the wiring board with a columnar conductor illustrated in FIGS. 1A to 1C.

A wiring board 10A with a columnar conductor according to the first modified example preferably has substantially the same configuration as in the first preferred embodiment, except that the columnar conductor 12 is connected to the surface electrode 11E of the wiring board 11, as illustrated in FIG. 9. Accordingly, the wiring board 10A with a columnar conductor can be manufactured by substantially the same method as that used in the first preferred embodiment. For this modified example, the surface electrode 11E, which is connected to the columnar conductor 12, of the wiring board 11 functions as a catch pad, the area of the interface between the wiring board 11 and the surface electrode 11E is increased, and resistance to a drop test or a lateral push test is improved. When the first surface-mountable electronic component 14 is connected to the columnar conductor 12 with the surface electrode 11E provided therebetween, heat generated in the first surface-mountable electronic component 14 can be dissipated through the surface electrode 11E and the columnar conductor 12. Other operational advantages similar to those in the first preferred embodiment can also be expected in the present modified example.

Second Modified Example

Figure 10:
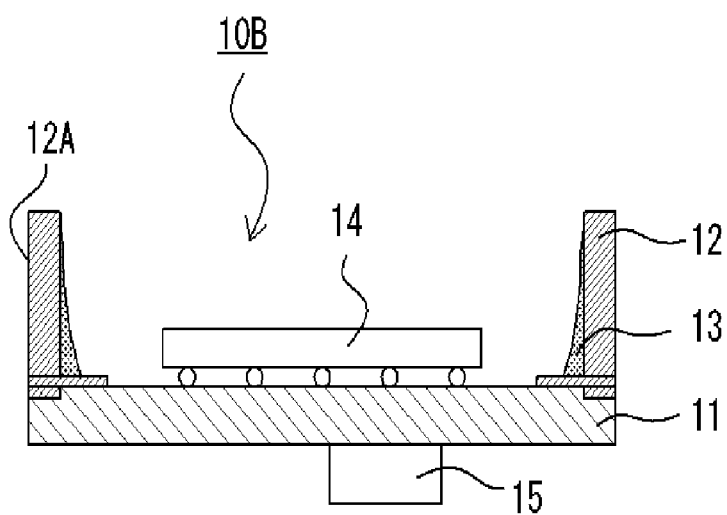
FIG. 10 is a cross-sectional view illustrating another modified example of the wiring board with a columnar conductor illustrated in FIGS. 1A to 1C.

A wiring board 10B with a columnar conductor according to the second modified example preferably has a configuration similar to that in the first preferred embodiment, except that an outside surface 12A of the columnar conductor 12 is exposed and is flush with the side of the wiring board 11, as illustrated in FIG. 10. In the first preferred embodiment, a plurality of wiring boards 10 with columnar conductors are manufactured as a group of boards, and the group of boards is cut at the midpoint of the columnar conductors 12 supported by the insulating support portions 13 of the neighboring wiring boards 11 and divided into individual wiring boards 10 with columnar conductors. In this modified example, in the group of boards, a plurality of columnar conductors 12 are arranged on the border between the neighboring wiring boards 10B with columnar conductors, and these columnar conductors 12 are connected by the insulating support portion 13. When this group of boards is cut along the border, the cutting line passes through the center of the plurality of columnar conductors 12, and the wiring board 10B with a columnar conductor, which includes the exposed outside surfaces 12A of the plurality of columnar conductors 12, is obtained, as illustrated in FIG. 10.

For the second modified example, because the outside surface 12A of each of the columnar conductors 12 is exposed, the solder wicks up along the outside surface 12A of the columnar conductor 12 when the wiring board 10B with a columnar conductor is connected to the motherboard, such that a solder fillet is produced. Because the solder wicks up along the side of the columnar conductor 12, the sized of the solder joint is increased and thus resistance to a tensile test and a lateral push test is increased. Other operational advantages similar to those in the first preferred embodiment can also be expected in this modified example.

Third Modified Example

Figure 11A:
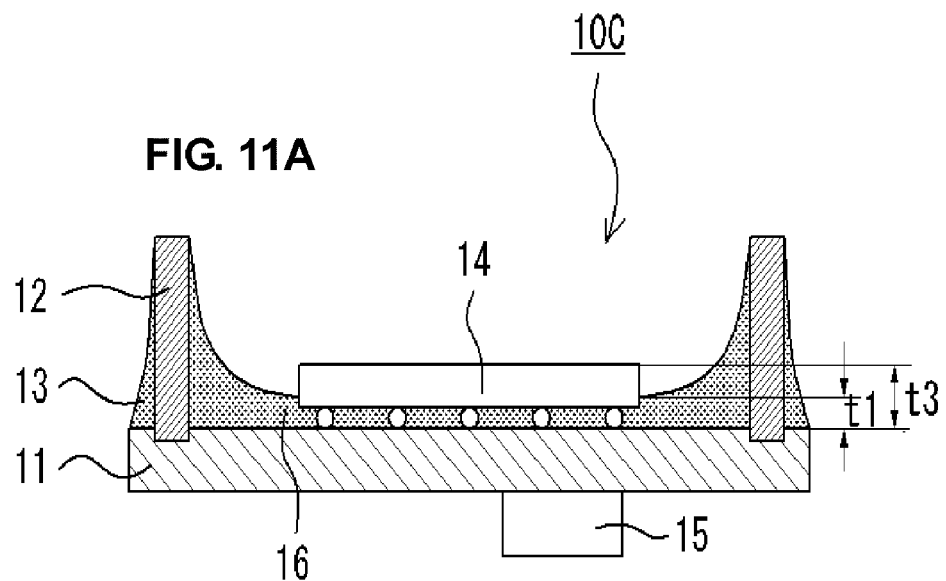
FIGS. 11A and 11B are cross-sectional views illustrating still another modified example of the wiring board with a columnar conductor illustrated in FIGS. 1A to 1C.
Figure 11B:
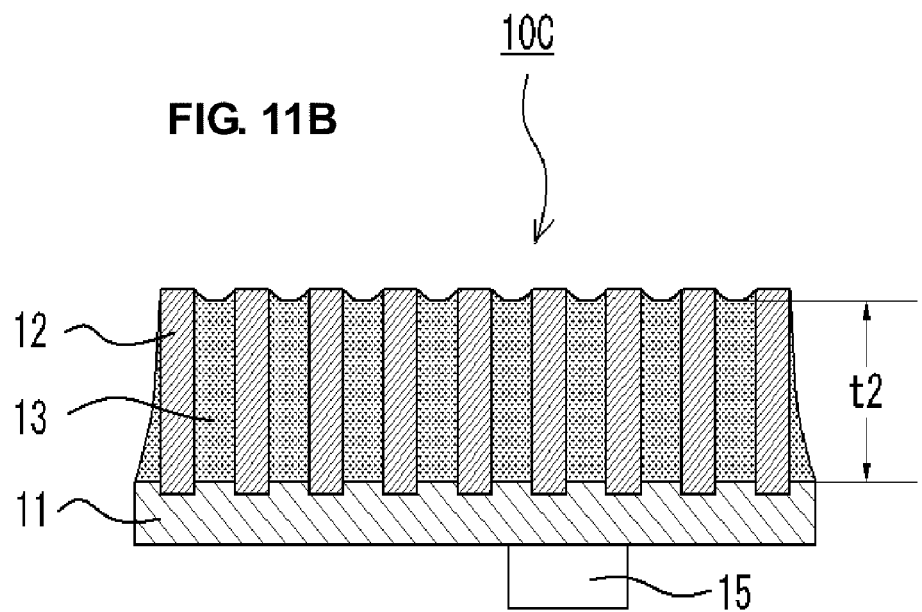

A wiring board 10C with a columnar conductor according to the third modified example preferably has a configuration similar to that in the first preferred embodiment, except that a resin portion 16 filled inside the plurality of columnar conductors 12 and sealing the region below from the upper surface of the first surface-mountable electronic component 14 is formed, as illustrated in FIGS. 11A and 11B. The upper surface of the resin portion 16 is lower than the upper surface of the first surface-mountable electronic component 14. That is, as illustrated in FIGS. 11A and 11B, a relationship of $t1 \leq t3$ is preferably satisfied, where $t1$ is the height of the upper surface of the resin portion 16 from the upper surface of the wiring board 11, $t2$ is the height of the upper surface of a recess of the insulating support portion 13 from the upper surface of the wiring board 11, and $t3$ is the height of the upper surface of the first surface-mountable electronic component 14 from the upper surface of the wiring board 11. The resin portion 16 is integrated with the insulating support portion 13 provided between the columnar conductors 12 by providing liquid resin between the first surface-mountable electronic component 14 and the wiring board 11. The height $t2$ is less than the height of the columnar conductor 13.

For the third modified example, because the first surface-mountable electronic component 14 is fixed on the upper surface of the wiring board 11 by the resin portion 16, even if the motherboard is deformed by bending, warping, or other distortion, for example, after the mounting on the motherboard, the first surface-mountable electronic component 14 is not likely to be separated from the wiring board 11. Other operational advantages similar to those in the first preferred embodiment can also be expected in this modified example.

Fourth Modified Example

Figure 12:
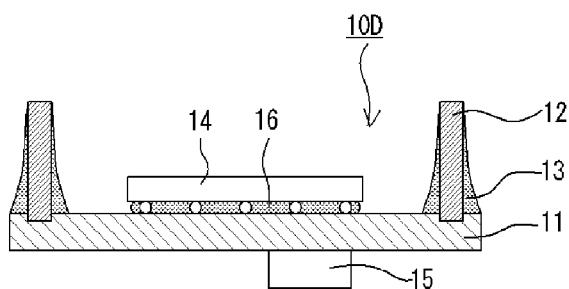
FIG. 12 is a cross-sectional view illustrating yet another modified example of the wiring board with a columnar conductor illustrated in FIGS. 1A to 1C.

A wiring board 10D with a columnar conductor according to the fourth modified example preferably has a configuration similar to that in the third modified example, except that the resin portion 16 is provided only in the gap between the first surface-mountable electronic component 14 and the wiring board 11, as illustrated in FIG. 12. In this case, because the first surface-mountable electronic component 14 is bonded to the upper surface of the wiring board 11 by the resin portion 16, the separation of the first surface-mountable electronic component 14 from the wiring board 11 is not likely to occur, as in the third modified example. Other operational advantages similar to those in the first preferred embodiment can also be expected in this modified example.

Fifth Modified Example

Figure 13A:
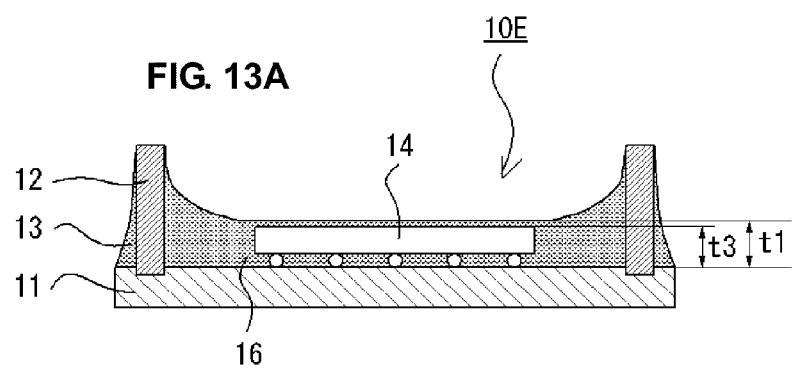
FIGS. 13A and 13B are cross-sectional views illustrating another modified example of the wiring board with a columnar conductor illustrated in FIGS. 1A to 1C.
Figure 13B:
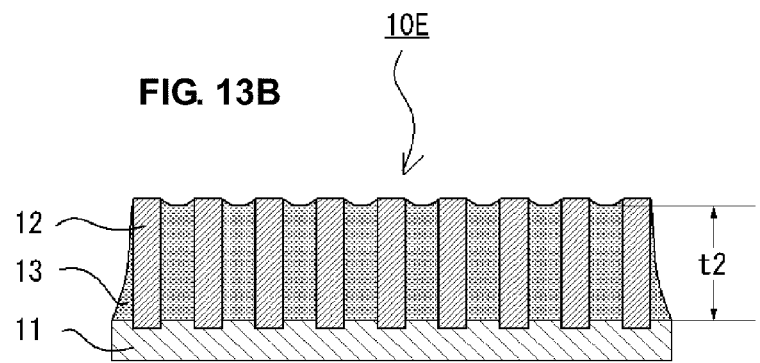

A wiring board 10E with a columnar conductor according to the fifth modified example includes the resin portion 16 formed inside the plurality of columnar conductors 12, as illustrated in FIGS. 13A and 13B, similar to the wiring board 10C in the third modified example. This modified example differs from the third modified example in that the resin portion 16 also covers the upper surface of the first surface-mountable electronic component 14. That is, the height of the tip of the columnar conductor 12 is sufficiently greater than the height of the upper surface of the semiconductor device 14, and the height $t1$ of the upper surface of the resin portion 16 from the upper surface of the wiring board 11 is greater than the height $t3$ of the upper surface of the first surface-mountable electronic component 14. The resin portion 16 is integrated with the insulating support portion 13 provided between the columnar conductors 12 by providing liquid resin between the first surface-mountable electronic component 14 and the wiring board 11, as in the third modified example. In this modified example, the first surface-mountable electronic component 14 can be substantially entirely sealed with resin and thus be protected from an external environment. Additionally, other operational advantages similar to those in the third modified example can also be expected in this modified example.

Sixth Modified Example

Figure 14:
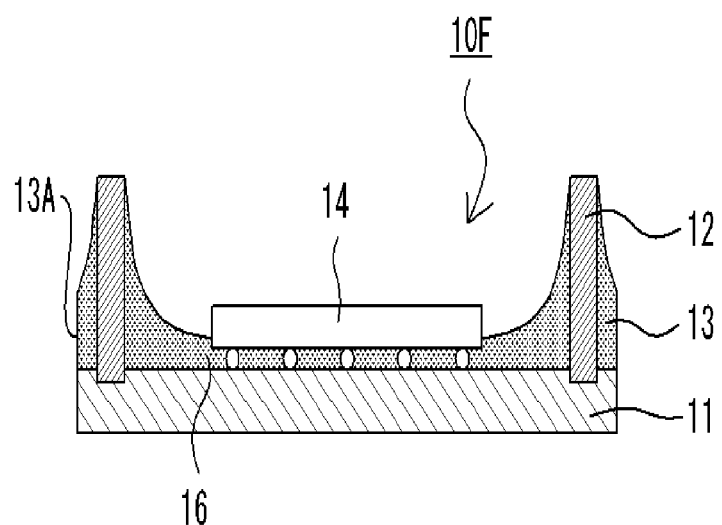
FIG. 14 is a cross-sectional view illustrating another modified example of the wiring board with a columnar conductor illustrated in FIGS. 1A to 1C.

A wiring board 10F with a columnar conductor according to the sixth modified example preferably has a configuration similar to that in the third modified example, except that the insulating support portion 13 connecting the plurality of columnar conductors 12 includes a substantially vertical surface 13A provided in an outer region, as illustrated in FIG. 14. In this modified example, in the state of the group of boards, the plurality of columnar conductors 12 of the neighboring wiring boards 10F with columnar conductors are connected with each other by the insulating support portion 13, and the cutting line to cut the group of boards into individual wiring boards 10F with columnar conductors is located at the approximate midpoint of the connection therebetween. Cutting the group of boards along the cutting line forms the wiring board 10F with a columnar conductor, as illustrated in FIG. 14. For this modified example, the amount of resin used outside the columnar conductor 12 is greater than that in the third modified example, such that resistance to a lateral push test is increased. Other operational advantages similar to those in the third modified example can also be expected in this modified example.

Seventh Modified Example

Figure 15A:
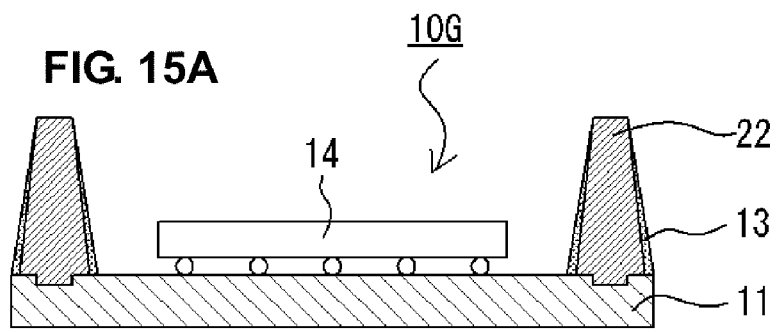
FIGS. 15A to 15D are cross-sectional views illustrating still other modified examples of the wiring board with a columnar conductor illustrated in FIGS. 1A to 1C.
Figure 15B:
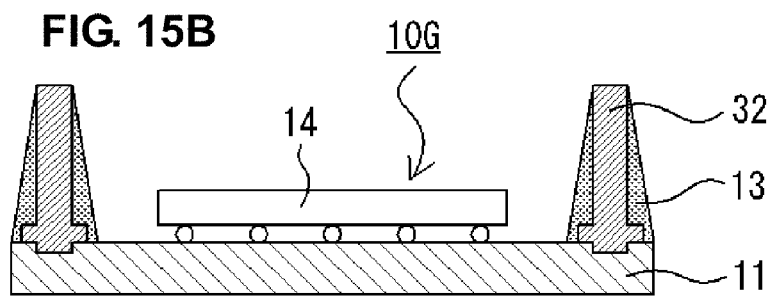
Figure 15C:
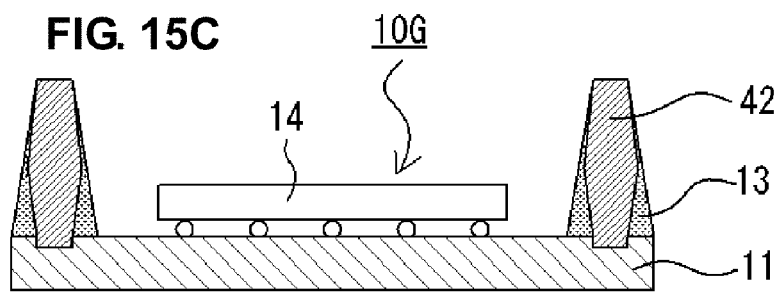
Figure 15D:
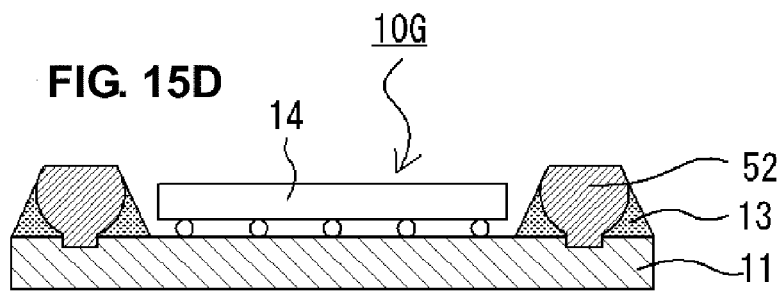

A wiring board 10G with a columnar conductor according to the seventh modified example preferably has a configuration similar to that in the first preferred embodiment, except that the columnar conductor 12 has a different cross-sectional shape, as illustrated in the cross-sectional views of FIGS. 15A to 15D. That is, the columnar conductor is not limited to a particular configuration. For example, the columnar conductor may preferably be an elongated truncated conical conductor 22, as illustrated in FIG. 15A. It may also be a columnar conductor 32 having a substantially flange-shaped portion in its base, as illustrated in FIG. 15B, and a columnar conductor 42 having a tsuzumi shape, i.e., a Japanese drum, as illustrated in FIG. 15C. Furthermore, it may also be a substantially spherical conductor 52, as illustrated in FIG. 15D. Other operational advantages similar to those in the first preferred embodiment can also be expected in this modified example. The columnar conductor may preferably be fired simultaneously with the wiring board to provide increased strength. However, the columnar conductor may be formed after the formation of the wiring board, such as a solder bump having a particular height, for example.

Eighth Modified Example

A wiring board 10H with a columnar conductor according to the eighth modified example preferably has a configuration similar to that in the first preferred embodiment, except that the insulating support portion 13 has a different shape, as illustrated in the cross-sectional views of FIGS. 16A and 16B. That is, as illustrated in FIG. 16A, the plurality of columnar conductors 12 may be independently supported by the insulating support portion 13 without being connected to each other by the insulating support portion 13. In this case, even if a stress is applied on the wiring board 10H, the columnar conductors 12, and the connections therebetween, because the columnar conductors 12 themselves are deformable, the applied stress can be relieved and the occurrence of cracks in the wiring board 10H and the columnar conductors 12 can be prevented. In this case, because the amount of resin used is less than that in the first preferred embodiment, the liquid resin wicks up to a region slightly below the top end surface of each of the columnar conductors 12, and the top end of the side of the columnar conductor 12 is exposed such that an exposed portion 12B is provided. As illustrated in FIG. 16B, a flange portion 12C is provided in the vicinity of the top end portion of each of the columnar conductors 12. The flange portion 12C can preferably block the liquid resin from wicking up, and the columnar conductor 12 is exposed above from the flange portion 12C. Similar to FIG. 16A, the columnar conductors 12 are independently supported by the insulating support portion 13. For this modified example, although the strength of the support of the columnar conductors 12 is reduced, the amount of resin used is advantageously reduced. In this case, the liquid resin wicks up due to wettability, not capillary action.

Figure 17:
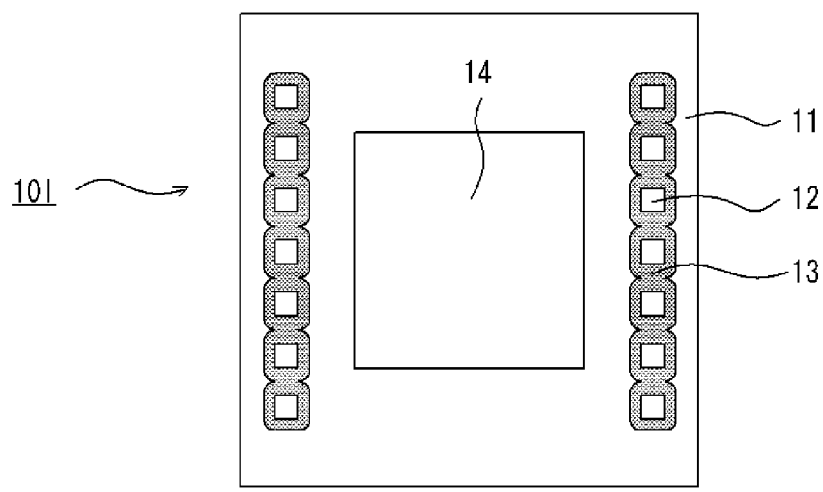
FIG. 17 is a plan view illustrating another modified example of the wiring board with a columnar conductor illustrated in FIGS. 1A to 1C.
Figure 18:
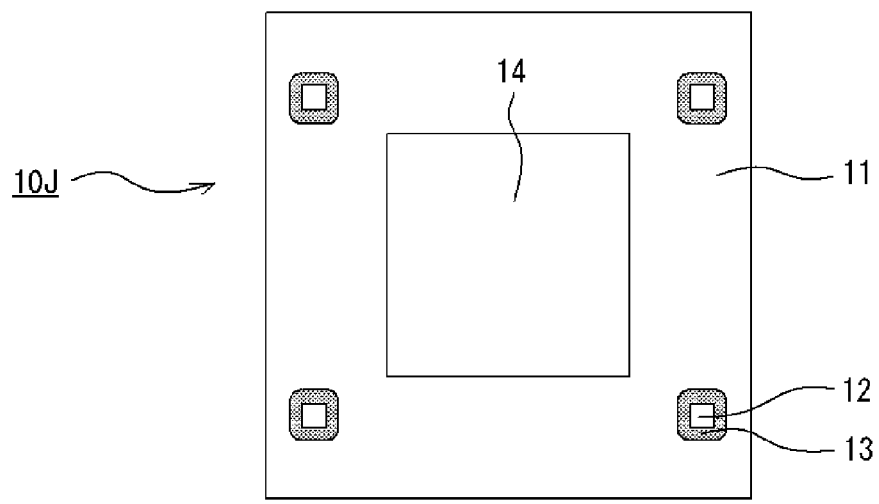
FIG. 18 is a plan view illustrating still another modified example of the wiring board with a columnar conductor illustrated in FIGS. 1A to 1C.
Figure 19:
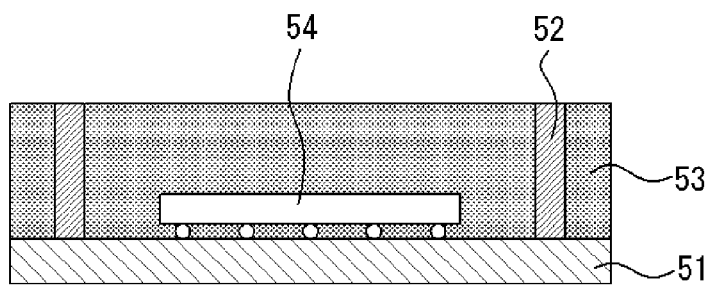
FIG. 19 is a cross-sectional view illustrating an example when a conventional multilayer ceramic board with a projection electrode is used to be disposed on a motherboard.

In the first preferred embodiment, the plurality of columnar conductors 12 are arranged along substantially the entire outer peripheral region of the wiring board 11$j$ as an example. The number of columnar conductors 12 can be appropriately set. FIG. 17 illustrates an example in which the plurality of columnar conductors 12 are arranged in side portions of the wiring board 11 that face each other such that the columnar conductors 12 at one side end face those at the other side end and the columnar conductors 12 are connected by the insulating support portion 13. The insulating support portion 13 is arranged such that it expands toward its bottom in a cross section substantially perpendicular to the direction of arrangement of the columnar conductors 12, as illustrated in FIG. 1B, and it is recessed between the columnar conductors 12 in a cross section substantially parallel to the direction of arrangement of the columnar conductors 12, as illustrated in FIG. 1$c$. FIG. 18 illustrates an example in which the columnar conductors 12 are disposed at each of the four corners and the columnar conductors 12 are independently supported by the insulating support portion 13. The insulating support portion 13 is arranged in the shape of a rectangle that expands toward its bottom.

The present invention is not limited to any of the above-described preferred embodiments, and the design of each of the components thereof can be changed as appropriate. For example, when at least one surface-mountable electronic component is disposed on a second main surface (the surface opposite to a columnar conductor) of a wiring board with a columnar conductor, the surface-mountable electronic component on the second main surface of the wiring board may preferably be sealed with resin, or may also be overlaid with a metal casing, instead of the resin, to protect the surface-mountable electronic component. A wiring board including a columnar conductor is encompassed in preferred embodiments of the present invention as long as it includes a plurality of columnar conductors that are supported by an insulating support portion from their respective sides.

Preferred embodiments of the present invention are suitable for use as a wiring board disposed on a mobile communication device, such as a cellular phone, for example.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wiring board with a columnar conductor comprising:
a wiring board including a first main surface;
at least one columnar conductor disposed on the first main surface of the wiring board; and
an insulating support portion arranged to support and be in direct physical contact with a peripheral side of the at least one columnar conductor and having an external shape that continuously expands from a tip of the at least one columnar conductor to the wiring board such that a width of the insulating support portion at the tip of the at least one columnar conductor is less than a width of the insulating support portion at the wiring board.

2. The wiring board with a columnar conductor according to claim 1, wherein the at least one columnar conductor on the first main surface of the wiring board includes a plurality of columnar conductors, and the insulating support portion does not connect the plurality of columnar conductors in a cross section that is substantially perpendicular to the first main surface.

3. The wiring board with a columnar conductor according to claim 2, wherein the plurality of columnar conductors are arranged in an outer peripheral region of the first main surface of the wiring board, and a surface-mountable electronic component is disposed inside the outer peripheral region of the first main surface.

4. The wiring board with a columnar conductor according to claim 3, wherein a resin portion is arranged so as to at least fill a gap between the surface-mountable electronic component and the wiring board, and a height of the resin portion is less than a height of the insulating support portion.

5. The wiring board with a columnar conductor according to claim 1, wherein the insulating support portion primarily includes resin.

6. The wiring board with a columnar conductor according to claim 1, wherein the wiring board is a multilayer ceramic board including a plurality of laminated ceramic layers.

7. The wiring board with a columnar conductor according to claim 6, wherein the columnar conductor is made of a sintered metal fired simultaneously with the ceramic layers.

8. A wiring board with a columnar conductor comprising:
a wiring board having a first main surface;
a plurality of columnar conductors disposed on an outer peripheral region of the first main surface of the wiring board and arranged such that a longitudinal axis of each of the plurality of columnar conductors extends in a direction substantially perpendicular to the first main surface of the wiring board;
an insulating support portion arranged to support a side of each of the columnar conductors; and
a surface-mountable electronic component disposed inside the outer peripheral region of the first main surface.

9. The wiring board with a columnar conductor according to claim 8, wherein a distance from the first main surface of the wiring board to a tip of the columnar conductor is greater than a thickness of the surface-mountable electronic component.

* * * * *